United States Patent [19]
Jacob et al.

[11] Patent Number: 6,152,818
[45] Date of Patent: Nov. 28, 2000

[54] FLOW CONTROL APPARATUS FOR A SEMICONDUCTOR MANUFACTURING WET BENCH

[75] Inventors: Steven D. Jacob, Crystal Lake, Ill.; Louis Hrkman, Jr., Williamsburg, Va.; Michael Laport, Chicago, Ill.

[73] Assignee: Siemens Building Technologies, Inc., Buffalo Grove, Ill.

[21] Appl. No.: 09/247,698

[22] Filed: Feb. 10, 1999

[51] Int. Cl.⁷ ............................. B08B 15/02
[52] U.S. Cl. ............................. 454/61; 454/187
[58] Field of Search ............... 454/56, 61, 187

[56] References Cited

U.S. PATENT DOCUMENTS

| | | | |
|---|---|---|---|
| 3,728,866 | 4/1973 | Layton . | |
| 3,752,056 | 8/1973 | Chamberlin et al. | 98/115 LH |
| 3,811,250 | 5/1974 | Fowler, Jr. | 454/56 |
| 4,377,969 | 3/1983 | Nelson | 98/115 LH |
| 4,466,454 | 8/1984 | Layton | 134/76 |
| 4,706,553 | 11/1987 | Sharp et al. | 98/115.3 |
| 4,976,815 | 12/1990 | Hiratsuka et al. | 156/345 |
| 4,982,605 | 1/1991 | Oram et al. | 454/56 |
| 5,170,673 | 12/1992 | Ahmed et al. | 73/865.9 |
| 5,240,455 | 8/1993 | Sharp | 454/61 |
| 5,401,212 | 3/1995 | Marvell et al. | 454/187 |
| 5,435,779 | 7/1995 | Sharp et al. | 454/61 |
| 5,470,275 | 11/1995 | Jacob et al. | 454/61 |
| 5,518,446 | 5/1996 | Jacob | 454/61 |
| 5,562,537 | 10/1996 | Zver et al. | 454/61 |
| 5,733,188 | 3/1998 | Jacob | 454/56 |
| 5,810,657 | 9/1998 | Pariseau | 454/61 |
| 5,951,394 | 9/1999 | Pariseau | 454/61 |
| 5,990,789 | 11/1999 | Berman et al. | 340/506 |

*Primary Examiner*—Harold Joyce
*Assistant Examiner*—Andrea M. Joyce
*Attorney, Agent, or Firm*—Greer, Burns & Crain, Ltd.

[57] ABSTRACT

Apparatus for controlling the volume of air that is supplied and exhausted from a electronic semiconductor manufacturing wet bench is disclosed. The volume of air that is exhausted from the wet bench is increased during predetermined portions of the manufacturing process and is reduced during noncritical times as a function of predetermined conditions that may be detected or otherwise determined during the manufacturing process.

20 Claims, 7 Drawing Sheets

FLOW CONTROL APPARATUS FOR A SEMICONDUCTOR MANUFACTURING WET BENCH

The present invention relates generally to the control of the ventilation of a wet bench for manufacturing electronic semiconductor products and more particularly to a apparatus for controlling the exhausting of fumes that are produced during the manufacturing of such electronic semiconductor products in a way which conserves energy costs without sacrificing safety.

Manufacturing stations for manufacturing many types of electronic semiconductor products are known in the electronic industry as wet benches. A wet bench is a process equipment tool that is used to etch semiconductor wafers during the manufacturing of them. The etching is done by acids that are inherently dangerous to individuals that may be present in the area, and for that reason, the acid fumes must be expelled during and after use of the acid during the manufacturing process. The wet benches generally have an enclosure which has an access door for users, and the enclosure is typically connected to an exhaust system for removing the noxious fumes so that the users will not be exposed to them.

Wet benches are typically used intermittently throughout a work day. Each time they are used, a tank associated with the wet bench is filled with acid, which is then expelled after the semiconductotr wafers are etched. During the filling and use of the acid, the fumes produced must be exhausted to prevent any contact with users. Manufacturers of semiconductors are generally not concerned with the amount of flow of air that is moved through the interior of the wet bench enclosures, and the flow is generally constant regardless of the presence or impounding presence of acid being introduced or when the wet bench is idle.

The volume of air that is moved through a wet bench can significantly impact on the cost of operating the wet bench. Since the replacement air that is introduced into the wet bench must be clean room quality air, it has to be processed and filtered to remove any particles that could otherwise contaminate the semiconductor wafers during their manufacture. It is also necessary to condition the air with respect to its temperature and humidity and there are also costs associated with such conditioning. Also, exhausted air from the wet bench must have acid fumes removed from the exhaust before the air can be vented to atmosphere.

With respect to the costs associated with operation of a wet bench, clean room replacement air can cost as high as $50–$60 per cubic foot per minute per year as well as additional scrubbing for EOC incineration costs which can range from $30–$150 per cubic foot per minute (CFM) per year, it is readily apparent that the costs for supplying and exhausting air through a wet bench are significant. For example, a 1500 CFM wet bench used two hours per day for 365 days a year can reduce its exhaust by 30% when it is not in use. Using a conservative cost for both makeup and exhaust scrubbing/VOC of $30 per CFM per year, the savings from a single wet bench would be about $12,375 per year.

Accordingly, it is a primary object of the present invention to provide an improved air flow control apparatus for a semiconductor manufacturing wet bench which significantly reduces the cost of operation of the wet bench by varying the amount of air flow through the wet bench between high and low flow conditions which are dictated by the nature of the activity that is occurring within the wet bench.

Another object of the present invention is to provide such an improved apparatus which is adapted to reduce the flow of air through the interior of a wet bench when conditions are such that fumes are not present and therefore a lower flow can be utilized.

A related object is to provide such an improved apparatus which does not jeopardize the safety of users working near wet benches, but by virtue of its operation, can significantly reduce the costs associated with supplying air to and exhausting air from the wet bench. Still another object of the present invention is to provide an apparatus for controlling the amount of flow of air through a wet bench, and which monitors the actual flow of air being exhausted so that it can be accumulated and used for STC? purposes.

An ancillary object lies in the provision of such data being available for transmission to the heating, ventilating and air conditioning system so that control of the HVAC system can be done in a manner which takes into account the amount of air that may be used by the wet benches.

Yet another object is to provide such an improved apparatus which is adapted to detect degradation of the operation of the system for supplying air to and exhausting air from the wet bench and to provide notification of alarm conditions immediately upon detection.

Still another object of the present invention is to provide such an apparatus which has the capability of integrating its operation with that of a heating, ventilating and air conditioning control system, and which can be controlled from a remote location, over a communication network.

These and other objects will become apparent upon reading the following detailed description of the present invention, while referring to the attached drawings, in which.

Figure 4:
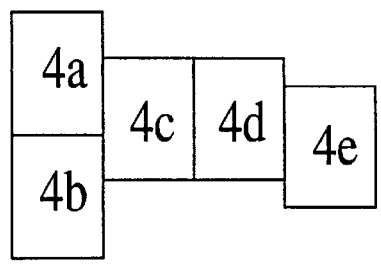
Figure 4A:
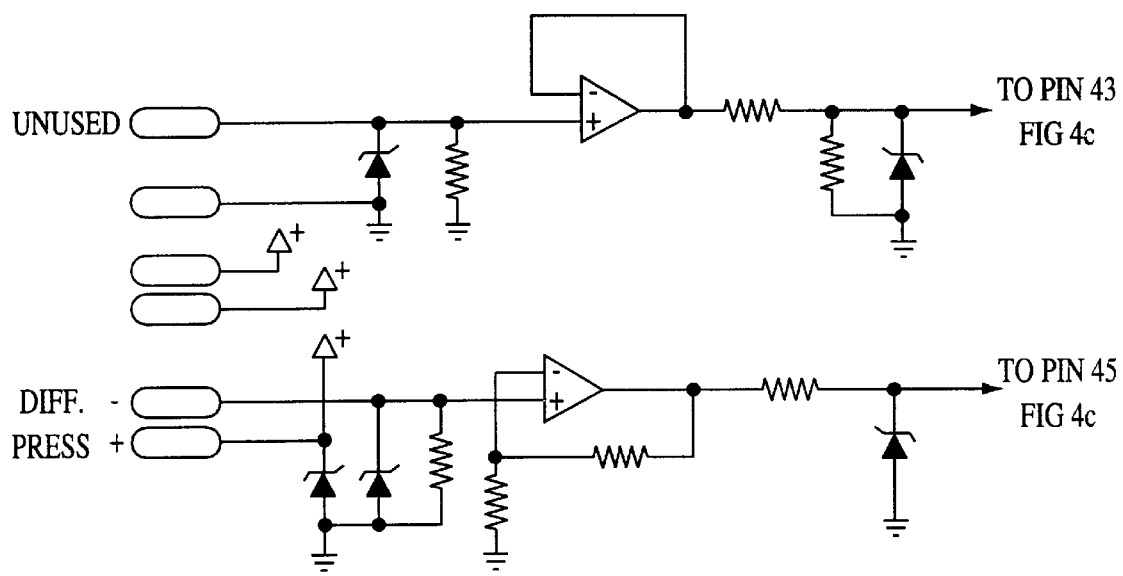

FIG. 4 is a block diagram illustrating the relative positions of FIGS. 4a, 4b, 4c, 4d and 4e to one another, and which together comprise a schematic diagram of the electrical circuitry for the controller portion of the apparatus embodying the present invention; and, FIGS. 4a, 4b, 4c, 4d and 4e, which if connected together, comprise the schematic diagram of the electrical circuitry for the wet bench controller means embodying the present invention.

DETAILED DESCRIPTION

Broadly stated, the present invention is directed to an apparatus for controlling the flow volume of air that is supplied to and exhausted from the interior of an electronic manufacturing wet bench of the type which utilizes corrosive chemicals, such as acids, to perform such manufacturing steps as etching wafers that are being fabricated within the wet bench. The apparatus varies the flow depending upon whether corrosive acids are going to be introduced into the wet bench enclosure or are being used therein, so that fumes within the wet bench enclosure are safely and effectively exhausted.

While wet benches typically have enclosures, some do not. In the event a wet bench does not have an enclosure, the exhaust duct is usually positioned in close proximity to the work area of the bench where acid is introduced so that fumes can be exhausted from the work area while acid is present. The opening to the exhaust duct is preferably very close to the acid retaining receptacle and the exhaust duct extends through the interior of the bench and then to a duct manifold and air cleaning equipment.

The wet benches are preferably exhausted by an exhaust system that includes a single blower connected to the exhaust manifold that is in turn connected to the individual ducts from multiple wet benches, and dampers may be provided in the individual ducts to control the flow from the individual wet benches. Alternatively, a blower associated with each duct that is capable of being driven at variable speeds to increase or decrease the flow of air from the wet bench can be used, but that alternative is most likely less cost effective if the flow is merely varied between high and low flow rates.

The apparatus of the present invention effectively varies the flow between high flow and low flow operation although the invention is not limited to such high/low flow variation and may be more than two flow levels or even a variable flow operation. For purposes of description herein, the full speed or high flow operation will be referred to as normal operation, with the lower speed or low flow condition being referred to as the setback speed. It should be understood that the setback set point can be varied depending upon safety requirements that are dictated by authorities of one form or another, but are preferably approximately 70% of the normal flow. The normal flow is generally considered to be the high flow condition and may be the maximum flow that can be produced by the system. However, it should be understood that a purge or emergency condition may be implemented wherein flow rates higher than the high flow or normal flow condition may be produced. This could be achieved by increasing the speed of the blower that is used to exhaust air from the wet benches through a manifold system wherein a duct is employed to exhaust fumes from the wet bench to a manifold and whereby the flow through the duct is principally controlled by the apparatus of the present invention utilizing a damper that is variably positioned between the high and low flow producing positions.

In the preferred embodiment, the apparatus is a two position control which varies between a normal high flow operation and a setback, low flow operation which is preferably approximately 70% of the high flow operation.

Figure 1:
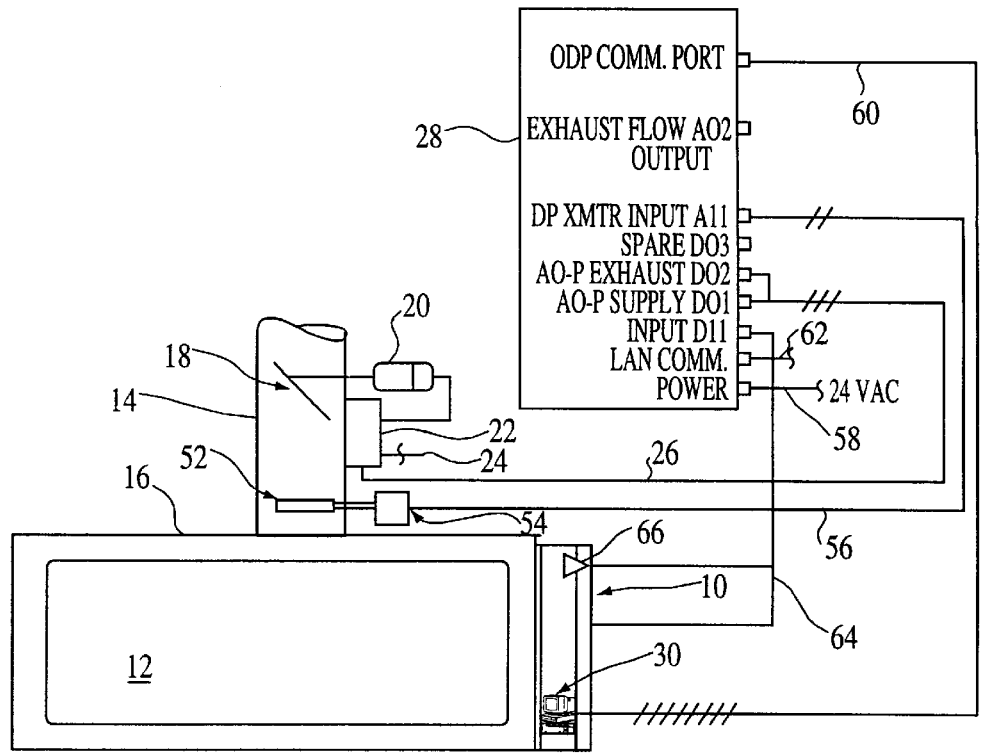
FIG. 1 is a schematic block diagram of apparatus of the present invention installed on a wet bench.

Turning now to the drawings and particularly FIG. 1, the apparatus of the present invention is shown to include a wet bench, indicated generally at 10, which has an access door 12 located in the front thereof through which users can attend to manufacturing steps that take place within the wet bench 10. An exhaust duct 14 is connected to the wet bench enclosure top 16 and duct 14 extends to an exhaust manifold (not shown) to which other exhaust ducts from other wet benches may be connected and the manifold is in communication with a blower and other equipment that is used to clean and exhaust air to atmosphere. Flow within the duct 14 is controlled by a pivotable damper 18 that is controlled by an actuator 20 that is preferably a pneumatic damper actuator, but which may be of various other designs including electrical actuators of various types.

The actuator 20 is controlled by an analog output pneumatic (AOP) module 22 which has a supply air line 24 which supplies air at preferably 18 to 30 p.s.i. gauge pressure for use by the actuator 20. The AOP module 22 is controlled by a multiconductor cable 26 that is connected to a controller 28 that is self-contained and preferably installed near the wet bench. The controller 28 includes the circuitry shown in FIGS. 4a–4e and controls the operation of the apparatus as established by control algorithms together with user input information that is supplied by an operator display panel 30 that is mounted to the front of the wet bench 10.

Figure 2:
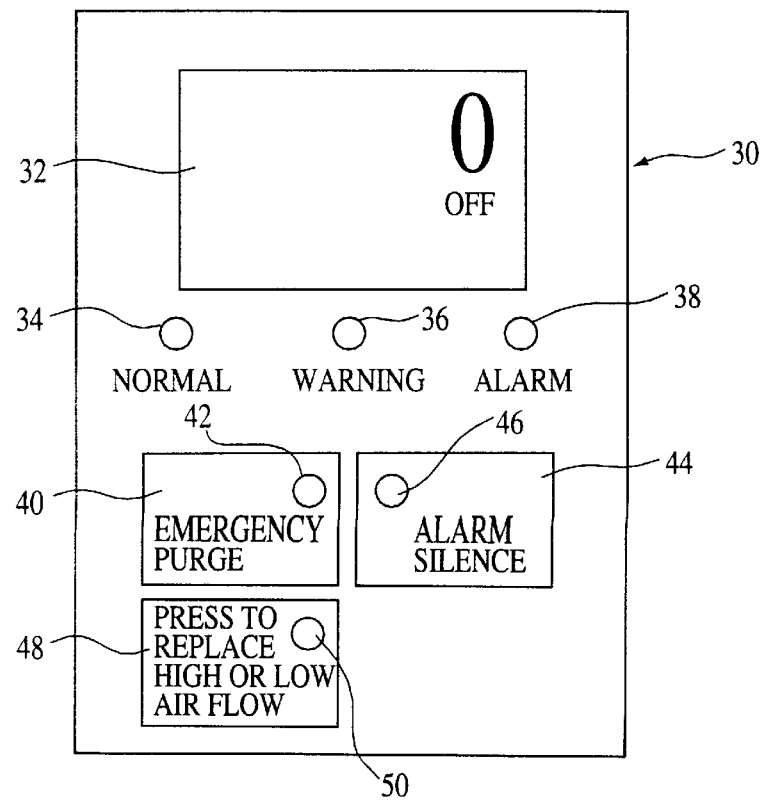
FIG. 2 is a front view of an operator display panel that is part of the apparatus shown in FIG. 1.

The operator display panel is shown in FIG. 2 and includes a display 32 that is preferably a liquid crystal display that during operation preferably continuously displays the operating air flow in cubic feet per minute. The display shown in FIG. 2 indicates the flow is zero and that the apparatus is not in operation. The display panel includes a preferably green status light 34, preferably an LED, which indicates normal operation, a similar light 36, preferably yellow and indicating a warning condition and another light 38 which is preferably red and indicates an alarm condition. The display panel includes an emergency purge pushbutton switch 40 with associated indicating light 42, an alarm silence pushbutton 44 and associate indicating light 46 and a pushbutton 48 and associated light 50 which can be used to replace the present flow with the alternate flow, i.e., to switch from high to low or low to high flow operation. The display 32 also has the capability of displaying the letters EEE for emergency mode and FFF for fail mode.

Returning to FIG. 1, the apparatus includes an air flow sensor 52 that is located within the exhaust duct 14 and it is connected to a differential pressure transmitter 54 that is connected as an input to the controller 28 via line 56. Line 58 is connected to a 24 VAC power source and multiconductor line 60 connects the controller 28 to the operator display panel 30. The display panel also includes an audio alarm horn, although a separate audio alarm can be mounted elsewhere in the area or on the wet bench itself.

Broadly stated, the controller provides high and low flow operation with the high flow set point determining the flow rate when the wet bench is in use and a low flow or setback set point when it is not in use. Alarming is based on measurement of the actual flow as determined by the flow sensor 52 compared to the set point. The selection of the high or low flow set point can be done in several ways, including a manually selected value from the user interface, i.e., the switch 48 on the operator display panel. A second way in which the set point can be set high or low is for an input line 64 to be connected to a sensor 66 which provides a digital input signal indicating the detection of acid in the tank for triggering the high flow operation. Another way to trigger the high flow condition is to interconnect the controller via the input DI1 with the wet bench control system itself which would switch the controller to a high flow condition when the wet bench system is activated to fill its tank with acid. Such an input signal preferably initiates an internal timer within the controller 28 which is preferably set to time out a safe period of time after the acid has been purged from the system which then results in the switching to the low flow or setback mode of operation.

From an operator or user standpoint, the controller 28 monitors the status of the wet bench during operation. Once the apparatus detects an operator's intent to use the equipment, it reacts in less than one second to change the exhaust flow from a setback flow to normal or full flow operation. During this process, the display panel indicates in CFM the actual flow through the wet bench and status lights will show normal (preferably green), marginal (preferably yellow), or alarm (preferably red) conditions. An audible alarm can be enabled to indicate a low flow or red condition. The alarm can also be activated to announce when the purge button has been pushed. The purge button 40 can be pushed at any time which opens the control damper 18 to its full open position such as might be required if the operator encounters a spill or other unsafe condition. The operator can manually set the flow from low or high flow conditions to the reverse. Once the wet bench is out of service or the apparatus indicates that it is no longer being used, a time delay can be set to reduce the exhaust flow to its setback set point. The operator is afforded for safety by knowing that what the actual flow in CFM is through the displaying of this information at the display panel and has the ability to increase or decrease flow or perform an emergency purge while he is present at the wet bench location.

Figure 3:
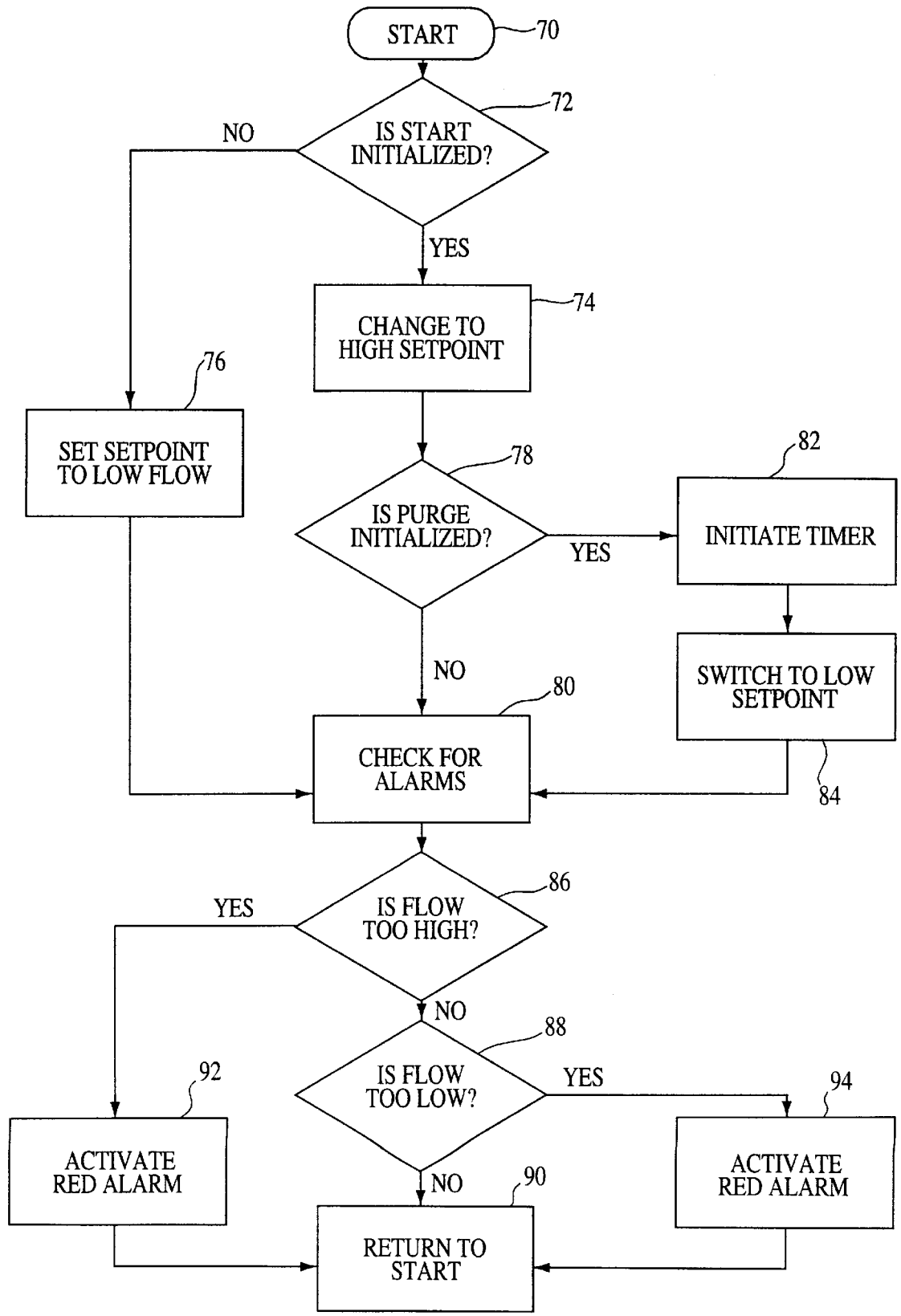
FIG. 3 is a flow chart illustrating the operation of a preferred embodiment of the apparatus of the present invention.

Turning now to FIG. 3 which is a flow chart illustrating the operation of the apparatus of the present invention, the control algorithm is shown to start (block 70) wherein a determination is made whether start has been initialized (block 72). If it has, then the apparatus changes to the high or normal set point (block 74) and if not, it sets the set point to the low flow or setback value (block 76). If it has changed to the high set point, it inquires whether purge has been initialized (block 78), which if not, merely checks for alarms (block 80) as is the case after the low flow set point has been set. If a purge has been initialized, then a timer is initiated or set (block 82). The amount of time before the timer times out is adjustable between zero and approximately 25 minutes, but can be a greater or smaller time period if desired. Once the timer times out, it switches the apparatus to the low flow set point (block 84) and thereafter checks for alarms. The checking for alarms is accomplished by inquiring as to whether the flow is too high (block 86), which if not, results in a determination as to whether the flow is too low (block 88). If it is neither too high nor too low, the algorithm returns to start block 90. If the flow is too high, it activates the red alarm 38 (block 92) and if the flow is too low, it also does the same (block 94).

Figure 4B:
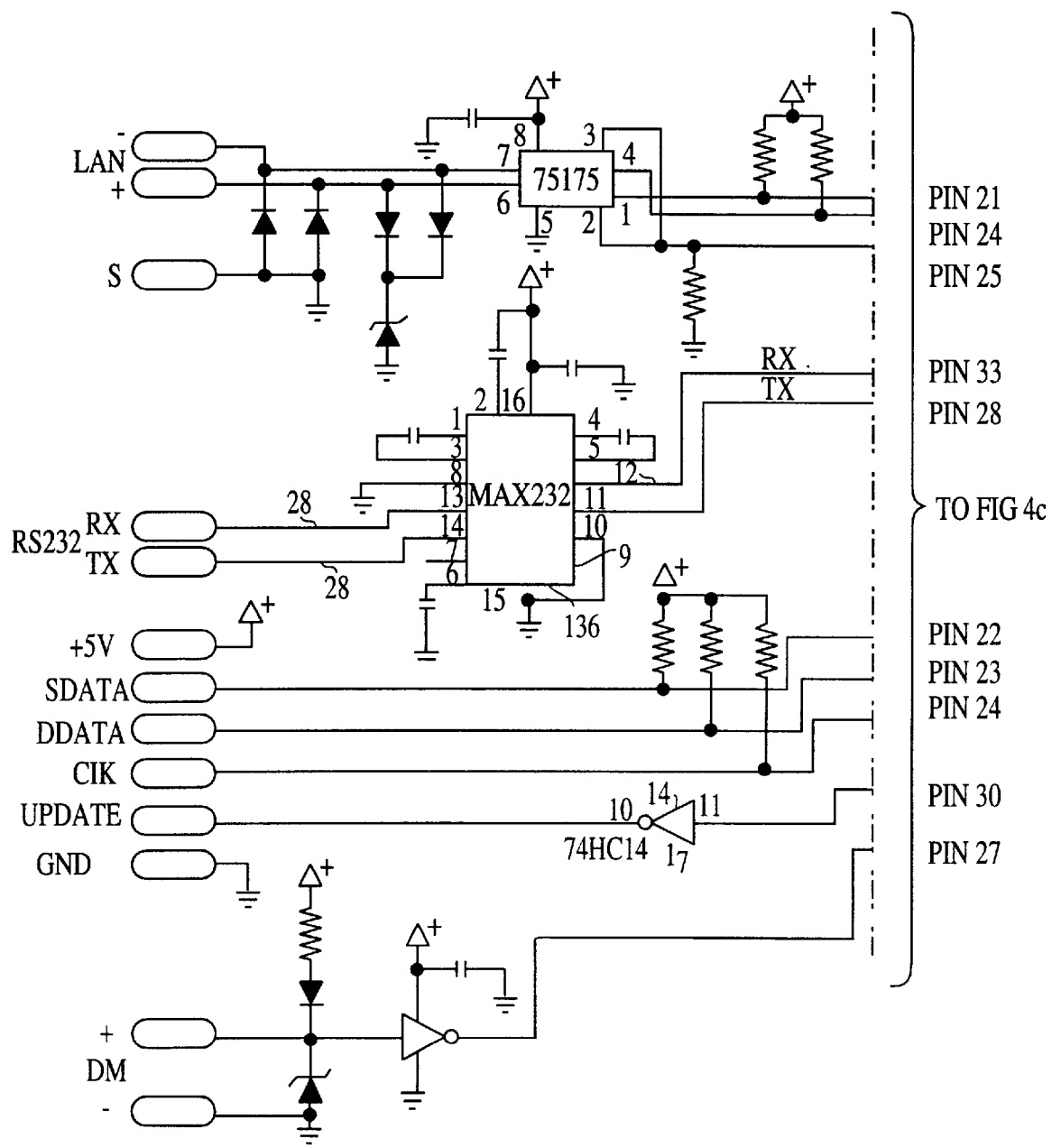
Figure 4C:
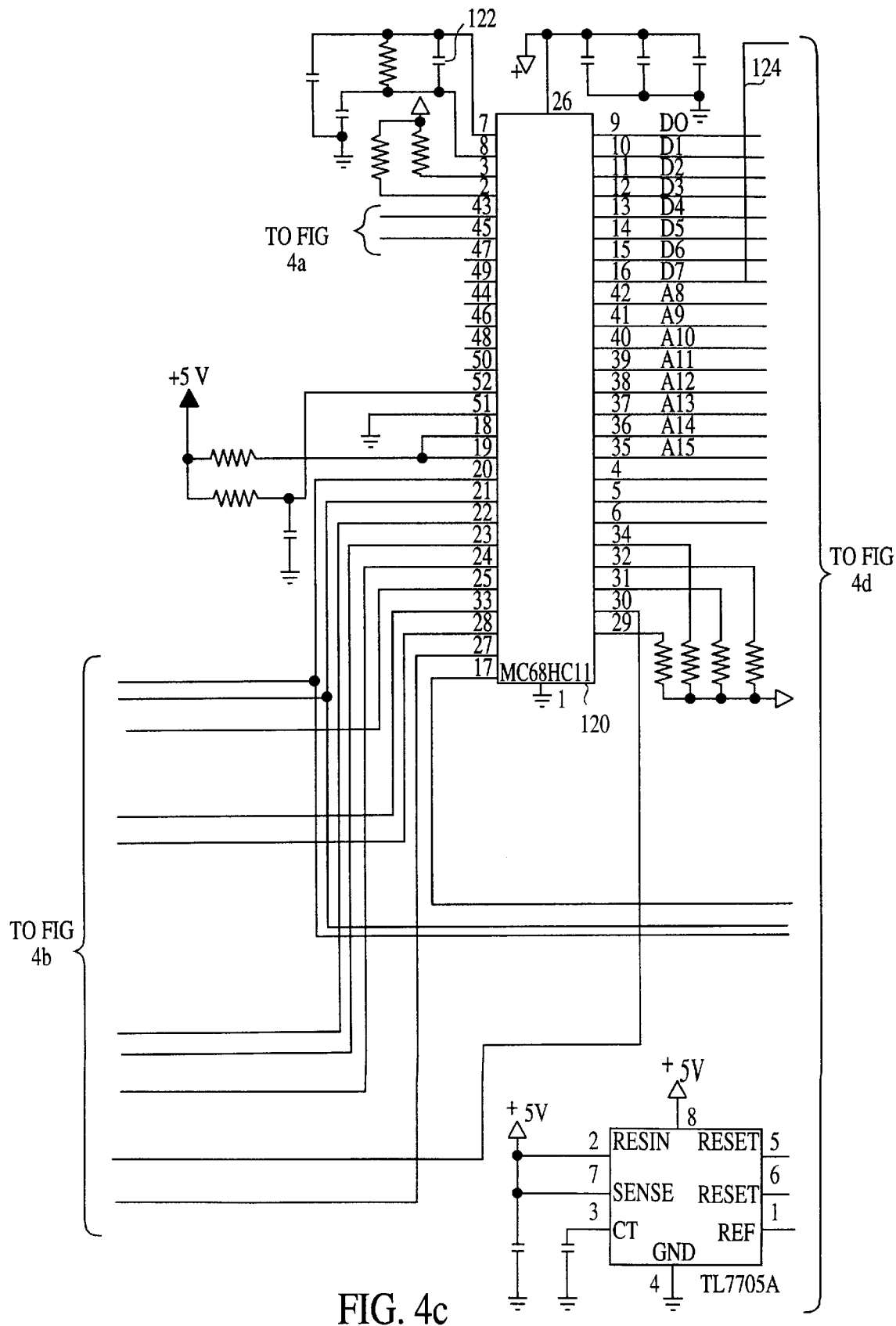
Figure 4D:
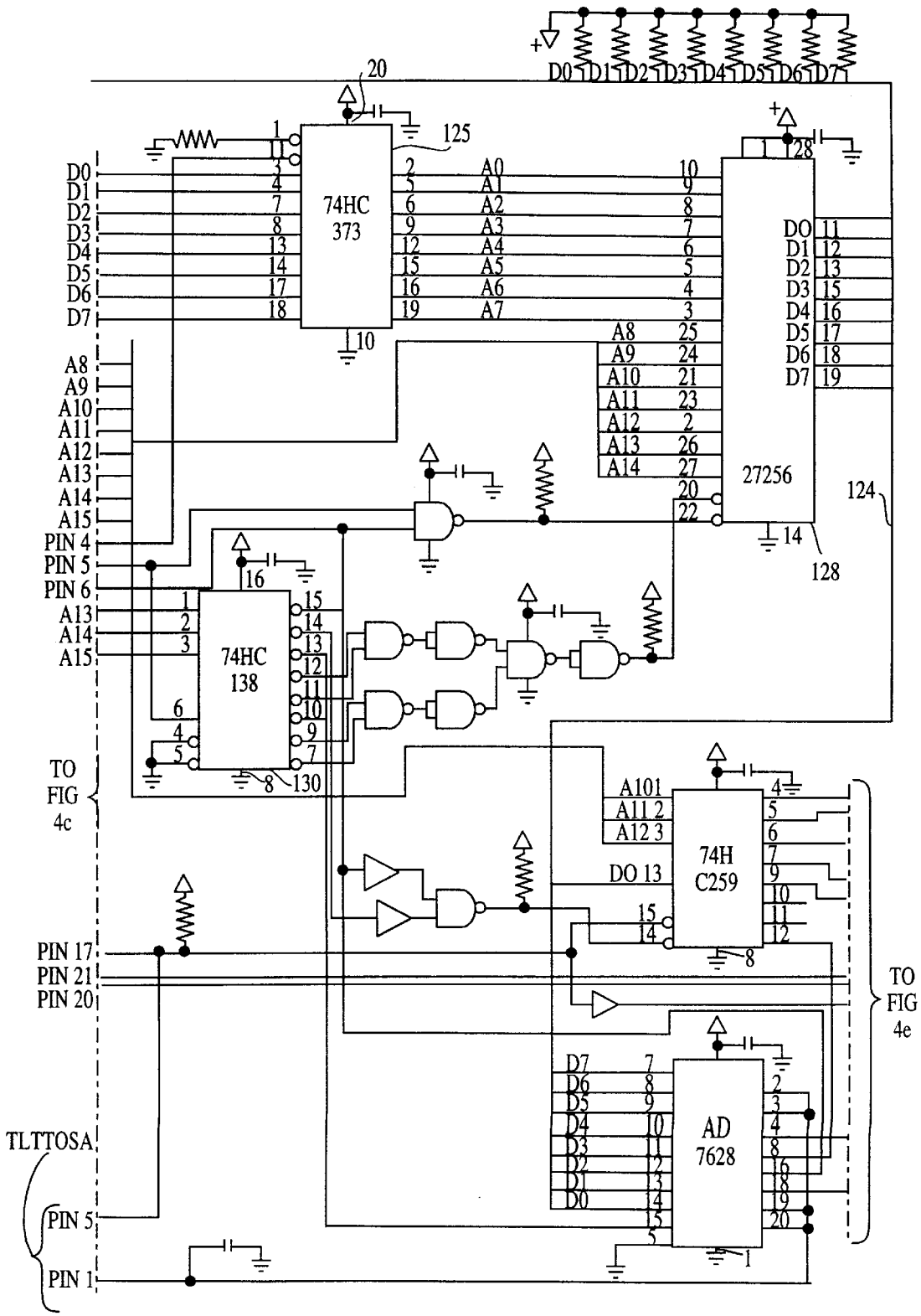
Figure 4E:
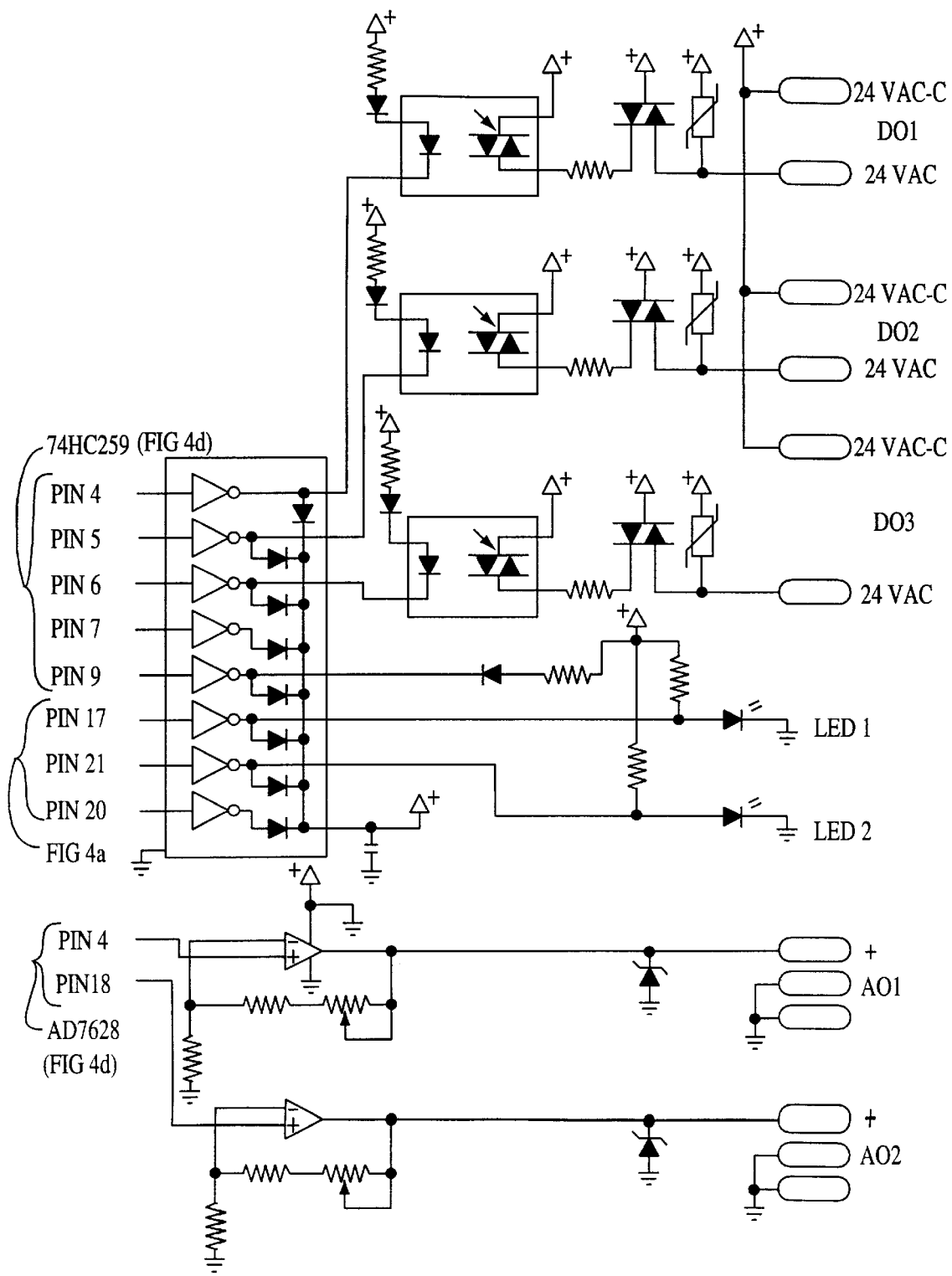

Referring to the composite electrical schematic diagram of the circuitry of the wet bench controller, if the separate drawings FIGS. 4a, 4b, 4c, 4d and 4e are placed adjacent one another in the manner shown in FIG. 4, the total electrical schematic diagram of the wet bench controller 20 is illustrated. The operation of the circuitry of FIGS. 4a through 4e will not be described in detail. The circuitry is driven by a microprocessor and the important algorithms that carry out the control functions of the controller will be hereinafter described. Referring to FIG. 4c, the circuitry includes a Motorola MC 68HC11 microprocessor 120 which is clocked at 8 MHZ by a crystal 122. The microprocessor 120 has a databus 124 that is connected to a tri-state buffer 126 (FIG. 4d) which in turn is connected to an electrically programmable read only memory 128 that is also connected to the databus 124. The EPROM 128 has address lines A0 through A7 connected to the tri-state buffer 126 and also has address lines A8 through A14 connected to the microprocessor 120.

The circuitry includes a 3 to 8-bit multiplexer 130, a data latch 132 (see FIG. 4d), a digital-to-analog converter 134, which is adapted to provide the analog outputs indicative of the volume of air being exhausted by the wet bench, which information may be provided to the HVAC control system. Referring to FIG. 4b, an RS232 driver 136 is provided for transmitting and receiving information through a hand held terminal (not shown). The other components are well known and therefore need not be otherwise described.

One of the significant advantages of the present invention is that the controller executes its control scheme in a repetitive and extremely rapid manner. The microprocessor samples flow signal information as well as sash door position signals at a speed of approximately one sample per 100 milliseconds during operation. The result is that rapid responsive control action is accomplished as is desired.

From the foregoing, it should be understood that apparatus embodying the present invention has been shown and described which effectively controls the flow of air through a semiconductor manufacturing wet bench of the type which utilizes corrosive or dangerous chemicals such as acids and the like for performing various steps during the manufacture of such semiconductors. The control of the flow is advantageous in that it assures safe operation of the wet bench and safety for the users working in the area. However, the apparatus additionally reduces the amount of air that is exhausted from the interior of the wet bench during those times where the chemicals or acids are not being used and thereby reduces the amount of make-up or replacement air that must be supplied to the wet bench enclosure and also reduces the amount of air that must be cleaned after it is removed from the wet bench before it can be vented to atmosphere. Since the air that is supplied to the wet bench must be of clean room quality and which involves considerable expense, the operating costs for a wet bench can be significantly reduced.

While various embodiments of the present invention have been shown and described, it should be understood that various alternatives, substitutions and equivalents can be used, and the present invention should only be limited by the claims and equivalents thereof.

Various features of the present invention are set forth in the following claims.

What is claimed is:

1. Apparatus for controlling the air flow through a semiconductor manufacturing wet bench of the type which requires the use of corrosive chemicals during the manufacture of the semiconductors, the wet bench having a work area in close proximity to a duct for exhausting air and fumes from the work area and a means for providing a negative pressure on the duct for exhausting air from the wet bench, said apparatus comprising:

means for indicating a first mode of operation responsive to an operating signal being received that is indicative of the impending introduction of corrosive chemicals into the wet bench work area;

means for varying the flow of exhausting air from the wet bench between at least a first and second volume responsive to said operating signals; and a controller means operatively connected to said mode indicating means and said flow varying means and adapted to generate said operating signals for controlling the operation of said varying means.

2. Apparatus as defined in claim 1 wherein said indicating means includes means for detecting the presence of corrosive chemicals in the wet bench work area.

3. Apparatus as defined in claim 1 wherein the wet bench has said controller is adapted to issue said operating signal at a time before corrosive chemicals are to be introduced into the work area, said indicating means indicating said first mode of operation responsive to said operating signal being generated.

4. Apparatus as defined in claim 3 wherein said indicating means removes said first mode of operation indication after expiration of a predetermined time period.

5. Apparatus as defined in claim 2 wherein said flow varying means comprises a damper means located in the duct.

6. Apparatus as defined in claim 1 further including a controller means operatively connected to said mode indicating means and adapted to generate signals for controlling the operation of said flow varying means.

7. Apparatus as defined in claim 6 wherein said flow varying means includes a flow sensing means located in the duct-adapted to determine the flow rate through the duct.

8. Apparatus for controlling the air flow through an enclosed semiconductor manufacturing wet bench of the type which requires the use of corrosive chemicals during the manufacture of the semiconductors, the wet bench having a work area in communication with a duct for exhausting air and fumes from the work area and an opening for supplying air thereto and a means for providing a negative pressure on the duct for exhausting air from the wet bench, said apparatus comprising:

controller means for generating flow control signals that vary the volume of air that is exhausted from the work area, the volume being variable between at least a high flow mode of operation and a low flow mode of operation;

indicating means operatively connected to said controller means for selectively indicating one of said high and low flow modes of operation responsive to the selective presence and absence of an indication of the impending introduction and use of corrosive chemicals within the wet bench;

means for varying the flow of exhausting air from the wet bench responsive to selective flow control signals being received from said controller means.

9. Apparatus as defined in claim 8 further comprising flow sensing means located in the duct adapted to determine the flow rate through the duct, said flow sensing means being operatively connected to said controller means and generating a signal that is applied to said controller means that is indicative of the flow rate.

10. Apparatus as defined in claim 9 further comprising a display means adapted to be installed adjacent to the wet bench, said display means being adapted to visually display the volume of flow through the duct.

11. Apparatus as defined in claim 10 wherein said flow mode indicating means comprises a means for detecting the presence of corrosive chemicals in the wet bench work area, said flow mode indicating means applying a high flow mode indication to said controller means in response to the detection of corrosive chemicals in the wet bench work area.

12. Apparatus as defined in claim 10 wherein said flow mode indicating means comprises an interconnect with the wet bench operating controller, said flow mode indicating means applying a high flow mode indication to said controller means in response to the receipt of a signal indicating that corrosive chemicals will be introduced into the wet bench work area.

13. Apparatus as defined in claim 10 wherein said display means includes an emergency purge switch, and said flow mode indicating means comprises said emergency purge switch.

14. Apparatus as defined in claim 10 wherein said display means is adapted to display status information relating to the operation of the apparatus, including one or more of the status conditions of normal condition, warning condition and alarm condition.

15. Apparatus as defined in claim 14 wherein said status information comprises a green indicator for normal operation, a yellow indicator for warning condition and a red indicator for alarm condition.

16. Apparatus as defined in claim 10 wherein said display means includes a switch for switching between said high and low flow modes of operation.

17. Apparatus as defined in claim 10 wherein said display means includes an audio alarm and a switch for silencing the operation of said audio alarm.

18. Apparatus as defined in claim 9 wherein said controller has predetermined set points for the respective flow rates of said high and low flow modes of operation, said controller being adapted to compare the flow rate signal received from said flow sensing means and generate a warning signal if the sensed flow rates vary from said predetermined set points by a first predetermined amount.

19. Apparatus as defined in claim 18 wherein said controller has predetermined set points for the respective flow rates of said high and low flow modes of operation, said controller being adapted to compare the flow rate signal received from said flow sensing means and generate an alarm signal if the sensed flow rates vary from said predetermined set points by a second predetermined amount that is greater than said first predetermined amount.

20. Apparatus as defined in claim 8 wherein said flow varying means comprises a damper means located in the duct.

* * * * *